(12) United States Patent
Liao et al.

(10) Patent No.: US 11,151,921 B2
(45) Date of Patent: Oct. 19, 2021

(54) DISPLAY DEVICE HAVING GATE DRIVING CIRCUIT WITH A DISCHARGE CIRCUIT AND CONTROL METHOD THEREOF

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Jiamin Liao, Beijing (CN); Zongxiang Li, Beijing (CN); Yao Liu, Beijing (CN); Zihua Zhuang, Beijing (CN); Jin Wang, Beijing (CN); Wenchang Tao, Beijing (CN); Guichun Hong, Beijing (CN); Hao Cheng, Beijing (CN); Min Zhou, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/822,808

(22) Filed: Mar. 18, 2020

(65) Prior Publication Data
US 2021/0150957 A1    May 20, 2021

(30) Foreign Application Priority Data
Nov. 15, 2019    (CN) .......................... 201911119146.7

(51) Int. Cl.
G09G 3/20    (2006.01)

(52) U.S. Cl.
CPC ....... *G09G 3/20* (2013.01); *G09G 2300/0426* (2013.01); *G09G 2310/0267* (2013.01); *G09G 2310/0272* (2013.01); *G09G 2310/0286* (2013.01); *G09G 2310/08* (2013.01); *G09G 2320/0209* (2013.01)

(58) Field of Classification Search
CPC ....................................................... G09G 3/20
See application file for complete search history.

(56) References Cited

U.S. PATENT DOCUMENTS

| | | | |
|---|---|---|---|
| 2009/0206339 A1* | 8/2009 | Park ....................... | B82Y 20/00 257/59 |
| 2012/0300133 A1* | 11/2012 | Saitoh .................. | G09G 3/3655 348/731 |
| 2019/0066613 A1* | 2/2019 | Chen ..................... | G09G 3/3655 |
| 2020/0135287 A1* | 4/2020 | Han ....................... | G11C 19/28 |
| 2020/0357317 A1* | 11/2020 | Wang .................... | G09G 3/3674 |

* cited by examiner

*Primary Examiner* — Long D Pham
(74) *Attorney, Agent, or Firm* — Brooks Kushman P.C.

(57) ABSTRACT

A gate driving circuit and a control method thereof, a display panel, and a display device are provided. The gate driving circuit includes multiple stages of shift register units and a shutdown discharge circuit. The shutdown discharge circuit includes a first discharge circuit. The first discharge circuit is electrically connected to a pull-up node and a discharge voltage terminal, and is configured to control the pull-up node to be electrically connected to the discharge voltage terminal under the control of a first control signal provided by a first control signal terminal.

16 Claims, 10 Drawing Sheets

DISPLAY DEVICE HAVING GATE DRIVING CIRCUIT WITH A DISCHARGE CIRCUIT AND CONTROL METHOD THEREOF

CROSS-REFERENCE TO RELATED APPLICATION

This application claims priority to Chinese Patent Application No. 201911119146.7 filed on Nov. 15, 2019, which is incorporated herein by reference in its entirety.

TECHNICAL FIELD

The present disclosure relates to the field of displaying technologies, and in particular, to a gate driving circuit and a control method thereof, a display panel, and a display device.

BACKGROUND

A Gate Driver ON Array (GOA), which is provided in a gate driving circuit on an array substrate, is a technology for integrating the gate driving circuit on a display substrate. The gate driving circuit is configured for supplying scanning signals to a pixel circuit, so that sub-pixels in the pixel circuit are charged and emit light, thereby achieving a displaying effect. Specifically, the gate driving circuit includes a plurality of shift registers, with each of the shift registers being configured for supplying the scan signal to a corresponding gate line.

In the related art, when the display device with the GOA technology is shut down, all of the gate lines output a high level signal, so that a Thin Film Transistor (TFT) of each sub-pixel in the pixel circuit is turned on, to enable the sub-pixel to be discharged. However, some circuits in the current display panel are not discharged. In this way, the residual voltages in these circuits may cause a problem of crosstalk within the display device upon the next startup, which will in turn cause abnormal display in a startup screen of the display device.

SUMMARY

Embodiments of the present disclosure provide a gate driving circuit and a control method thereof, a display panel, and a display device.

In a first aspect, an embodiment of the present disclosure provides a gate driving circuit, the gate driving circuit includes multiple stages of shift register units and a shutdown discharge circuit, wherein the shutdown discharge circuit includes a first discharge circuit. The first discharge circuit is electrically connected to a pull-up node and a discharge voltage terminal, and is configured to control the pull-up node to be electrically connected to the discharge voltage terminal under the control of a first control signal provided by a first control signal terminal.

Further, the first discharge circuit includes a first transistor, a second transistor, and a discharge capacitor. Both a first electrode of the first transistor and a control electrode of the first transistor are electrically connected to the first control signal terminal, and a second electrode of the first transistor is electrically connected to a control electrode of the second transistor. A first electrode of the second transistor is electrically connected to the pull-up node, and a second electrode of the second transistor is electrically connected to the discharge voltage terminal. A terminal of the discharge capacitor is connected to the first electrode of the first transistor, and another terminal of the discharge capacitor is connected to the second electrode of the first transistor.

Further, a display panel includes a pixel circuit, the pixel circuit includes a common electrode line and a common electrode line compensation structure, and the shutdown discharge circuit further includes a second discharge circuit. The second discharge circuit is electrically connected to the common electrode line or the common electrode line compensation structure, is electrically connected to the discharge voltage terminal, and is configured to control the common electrode line or the common electrode line compensation structure to be electrically connected to the discharge voltage terminal under the control of a second control signal provided by a second control signal terminal.

Further, the second discharge circuit includes a third transistor. A control electrode of the third transistor is electrically connected to the second control signal terminal, a first electrode of the third transistor is electrically connected to the common electrode line or the common electrode line compensation structure, and a second electrode of the third transistor is electrically connected to the discharge voltage terminal.

Further, the common electrode line compensation structure is a wire, and gate lines and data lines of the display panel are intersected with each other to form a plurality of pixel regions arranged in an array, and the common electrode line compensation structure is configured to connect the common electrodes within two pixel regions located in adjacent rows and a same column of the array.

Further, the first discharge circuit includes a first transistor, a second transistor and a discharge capacitor. Both a first electrode of the first transistor and a control electrode of the first transistor are directly connected to the first control signal terminal, and a second electrode of the first transistor is directly connected to a control electrode of the second transistor. A first electrode of the second transistor is directly connected to the pull-up node, and a second electrode of the second transistor is directly connected to the discharge voltage terminal. A terminal of the discharge capacitor is directly connected to the first electrode of the first transistor, and another terminal of the discharge capacitor is directly connected to the second electrode of the first transistor.

Further, the second discharge circuit includes a third transistor. A control electrode of the third transistor is directly connected to the second control signal terminal, a first transistor of the third transistor is directly connected to the common electrode line or the common electrode line compensation structure, and a second electrode of the third transistor is directly connected to the discharge voltage terminal.

Further, the shift register unit further includes: an input circuit, a reset circuit, an output circuit, a first pull-down control circuit, a first pull-down circuit, a second pull-down control circuit, a second pull-down circuit and a carry circuit. An input terminal of the input circuit is connected to an input signal terminal, an output terminal of the input circuit is connected to the pull-up node, and the input circuit is configured to charge the pull-up node under the control of the input signal. A first terminal of the reset circuit is connected to a low-potential terminal, a second terminal of the reset circuit is connected to the pull-up node, a control terminal of the reset circuit is connected to a reset signal line, and the reset circuit is configured to reset a potential at the pull-up node under the control of a reset signal. A first terminal of the output circuit is connected to a target clock signal line, a second terminal of the output circuit is connected to a gate line, a control terminal of the output circuit is connected to the pull-up node, and the output circuit is configured to output a clock signal to the gate line under the control of the potential at the pull-up node. An input terminal of the first pull-down control circuit is connected to a first power line, an output terminal of the first pull-down control circuit is connected to a first pull-down node, and the first pull-down control circuit is configured to control a potential at the first pull-down node under the control of a first power source line. A control terminal of the first pull-down circuit is connected to the first pull-down node, an input terminal of the first pull-down circuit is connected to the pull-up node, and an output terminal of the first pull-down circuit is connected to a first low-potential wire, and the first pull-down circuit is configure to pull down the potential at the pull-up node under the control of the potential at the first pull-down node. An input terminal of the second pull-down control circuit is connected to a second power line, an output terminal of the second pull-down control circuit is connected to a second pull-down node, and the second pull-down control circuit is configured to control a potential at the second pull-down node under the control of the second power line. A control terminal of the second pull-down circuit is connected to the second pull-down node, an input terminal of the second pull-down circuit is connected to the pull-up node, an output terminal of the second pull-down circuit is connected to the first low-potential wire, and the second pull-down circuit is configured to pull down the potential at the pull-up node under the control of the potential at the second pull-down node. A control terminal of the carry circuit is connected to the pull-up node, an input terminal of the carry circuit is connected to a target clock signal line, an output terminal of the carry circuit is connected to an input terminal of an input circuit of a next stage of shift register unit, and the carry circuit is configured to provide the clock signal on the target clock signal line to the input terminal of the input circuit of the next stage of shift register unit under the control of the potential at the pull-up node.

Further, the input circuit includes a fourth transistor. Both a first electrode of the fourth transistor and a control electrode of the fourth transistor are connected to the input signal terminal, and a second electrode of the fourth transistor is connected to the pull-up node. The reset circuit includes a fifth transistor. A control electrode of the fifth transistor is connected to a reset signal line, a first electrode of the fifth transistor is connected to a pull-up node, and a second electrode of the fifth transistor is connected to a first low-potential wire. The output circuit includes a sixth transistor. A control electrode of the sixth transistor is connected to the pull-up node, a first electrode of the sixth transistor is connected to the target clock signal line, and a second electrode of the sixth transistor is connected to the gate line. The first pull-down control circuit includes a seventh transistor, an eighth transistor, a ninth transistor and a tenth transistor. Both a control electrode of the seventh transistor and a first electrode of the seventh transistor are connected to the first power line, a second electrode of the seven transistor is connected to a first pull-down control node; a control electrode of the eighth transistor is connected to the first pull-down control node, a first electrode of the eighth transistor is connected to the first power line, a second electrode of the eighth transistor is connected to the first pull-down node; a control electrode of the ninth transistor is connected to the pull-up node, a first electrode of the ninth transistor is connected to the first pull-down control node, a second electrode of the ninth transistor is connected to the first low-potential wire; a control electrode of the tenth transistor is connected to the pull-up node, a first electrode of the tenth transistor is connected to the first pull-down node, and a second electrode of the tenth transistor is connected to the first low-potential wire. The first pull-down circuit includes an eleventh transistor, a twelfth transistor and a thirteenth transistor. A control electrode of the eleventh transistor is connected to the first pull-down node, a first electrode of the eleventh transistor is connected to the pull-up node, and a second electrode of the eleventh transistor is connected to the first low-potential wire. A control electrode of the twelfth transistor is connected to the first pull-down node, a first electrode of the twelfth transistor is connected to the pull-up node, and a second electrode of the twelfth transistor is connected to the first low-potential wire. A control electrode of the thirteenth transistor is connected to the first pull-down node, a first electrode of the thirteenth transistor is connected to the second electrode of the sixth transistor, and a second electrode of the thirteenth transistor is connected to a second low-potential wire. The second pull-down control circuit includes a fourteenth transistor, a fifteenth transistor, a sixteenth transistor and a seventeenth transistor. Both a control electrode of the fourteenth transistor and a first electrode of the fourteenth transistor are connected to the second power line, a second electrode of the fourteenth transistor is connected to a second pull-down control node; a control electrode of the fifteenth transistor is connected to the second pull-down control node, a first electrode of the fifteenth transistor is connected to the second power line, a second electrode of the fifteenth transistor is connected to the second pull-down node; a control electrode of the sixteenth transistor is connected to the pull-up node, a first electrode of the sixteenth transistor is connected to the second pull-down control node, a second electrode of the sixteenth transistor is connected to the first low-potential wire; a control electrode of the seventeenth transistor is connected to the pull-up node, a first electrode of the seventeenth transistor is connected to the second pull-down node, and a second electrode of the seventeenth transistor is connected to the first low-potential wire. The second pull-down circuit includes an eighteenth transistor, a nineteenth transistor and a twentieth transistor. A control electrode of the eighteenth transistor is connected to the second pull-down node, a first electrode of the eighteenth transistor is connected to the pull-up node, a second electrode of the eighteenth transistor is connected to the first low-potential wire; a control electrode of the nineteenth transistor is connected to the second pull-down node, a first electrode of the nineteenth transistor is connected to the pull-up node, a second electrode of the nineteenth transistor is connected to the first low-potential wire; a control electrode of the twentieth transistor is connected to the second pull-down node, a first electrode of the twentieth transistor is connected to the second electrode of the sixth transistor, and a second electrode of the twentieth transistor is connected to the second low-potential wire. The carry circuit includes a twenty-first transistor. A control electrode of the twenty-first transistor is connected to the pull-up node, a first electrode of the twenty-first transistor is connected to the target clock signal line, and a second electrode of the twenty-first transistor is connected to the input terminal of the input circuit of the next stage of shift register unit.

Further, the shift register unit further includes an input circuit, a reset circuit and an output circuit. The input circuit is configured to charge the pull-up node under the control of an input signal provided by an input terminal. The reset circuit is configured to reset a potential at the pull-up node under the control of a reset signal provided by a reset terminal. The output circuit is configured to control a gate driving signal outputting terminal to output the gate driving signal under the control of both a potential at a pull-down node and the potential at the pull-up node.

In a second aspect, an embodiment of the present disclosure provides a display panel. The display panel includes the above gate driving circuit.

Further, the display panel further includes a pixel circuit, the pixel circuit includes: a plurality of gate lines arranged in rows and a plurality of data lines arranged in columns on a base substrate. The gate lines and the data lines are intersected with each other to form a plurality of pixel regions. A Thin Film Transistor (TFT), a pixel electrode and a common electrode are disposed in each of the pixel regions, a source electrode of the TFT is connected to the data line, and a drain electrode of the TFT is connected to the pixel electrode. The display panel further includes a plurality of common electrode lines arranged in rows and a plurality of common electrode line compensation structures arranged in columns. The common electrodes arranged in a same row are connected to a same common electrode line, and the common electrodes arranged in a same column and adjacent to each other are connected to each other through the common electrode line compensation structure. The shutdown discharge circuit includes a second discharge circuit. The second discharge circuit is electrically connected to the common electrode line or the common electrode line compensation structure, and is configured to control the common electrode line or the common electrode line compensation structure to be electrically connected to the discharge voltage terminal under the control of a second control signal provided by a second control signal terminal.

In a third aspect, an embodiment of the present disclosure provides a control method for the above gate driving circuit. The method includes: outputting, by the first control signal terminal in a shutdown phase, the first control signal. The first discharge circuit is configured to control an electrical connection between the pull-up node and the discharge voltage terminal under the control of the first control signal.

Further, the method further includes: outputting, by the second control signal terminal in the shutdown phase, the second control signal. The second discharge circuit is configured to control an electrical connection between the common electrode line or the common electrode line compensation structure and the discharge voltage terminal under the control of the second control signal.

In a fourth aspect, an embodiment of the present disclosure provides a display device. The display device includes the above display panel.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

Technical solutions in embodiments of the present disclosure will be clearly and completely described below in connection with the accompanying drawings in embodiments of the present disclosure. Apparently, the described embodiments are merely a part, but not all, of embodiments of the present disclosure. Based on the embodiments of the present disclosure, all other embodiments obtained by a person skilled in the art without any creative efforts should fall within the protection scope of the present disclosure.

Figure 1:
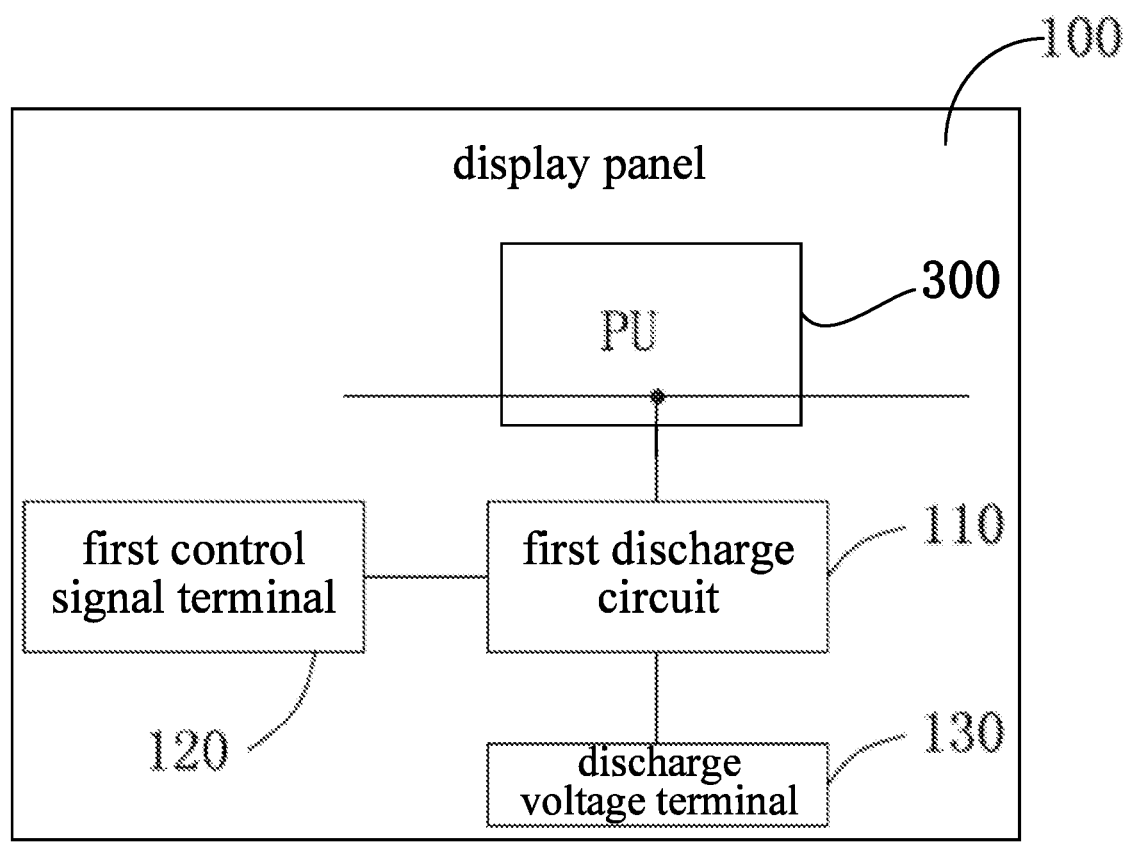
FIG. 1 is a schematic structural diagram of a first discharge circuit in a shutdown discharge circuit according to an embodiment of the present disclosure.
Figure 2:
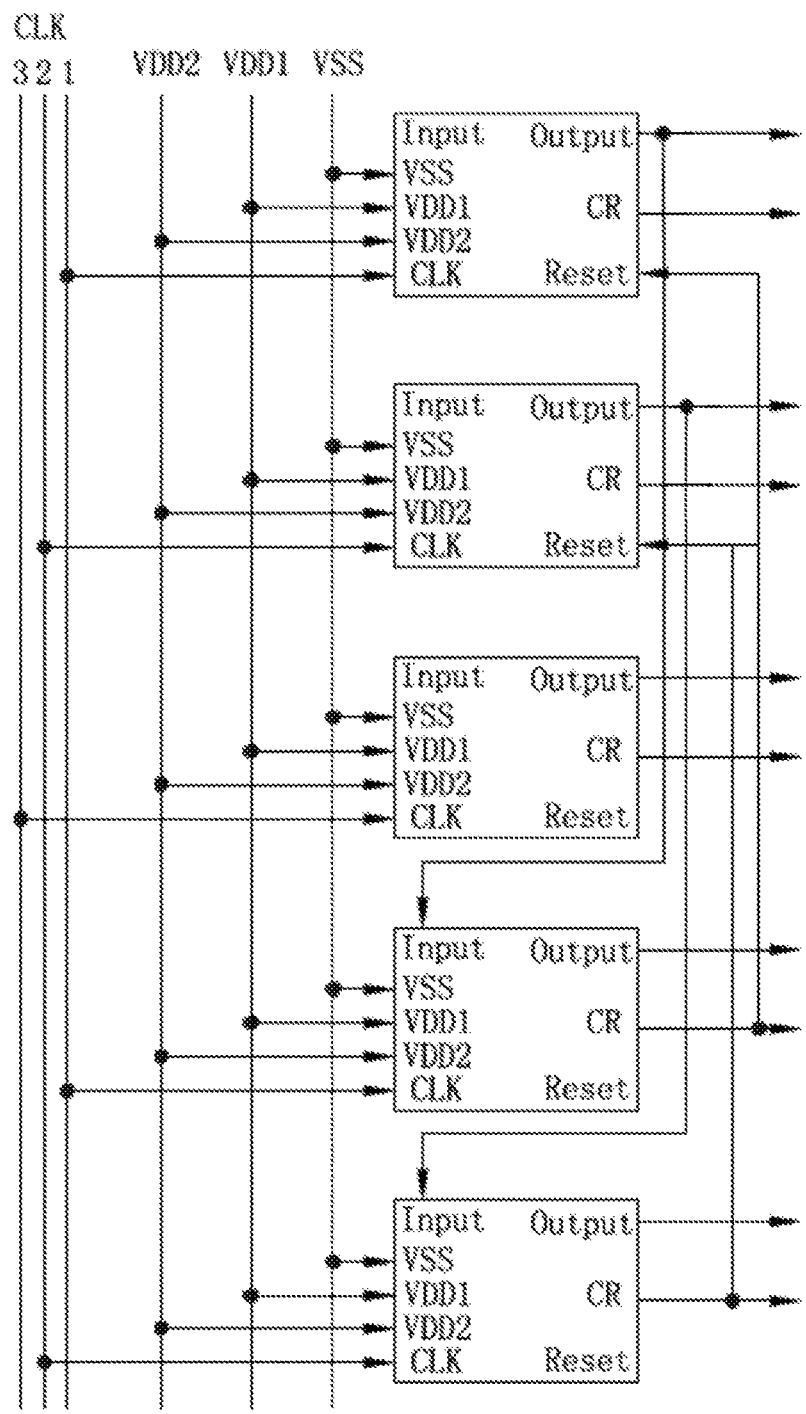
FIG. 2 is a schematic structural diagram of a gate driving circuit in a display panel in FIG. 1.

As shown in FIGS. 1 and 2, an embodiment of the present disclosure provides a gate driving circuit. The gate driving circuit is applied to the display panel 100, including multi-stage shift register units and the respective shutdown discharge circuits. Each of the shift register units, such as a shift register unit 300 which is schematically shown in FIG. 1, includes a pull-up node PU. The shutdown discharge circuit includes a first discharge circuit 110. The first discharge circuit 110 is configured to control the pull-up node PU to be electrically connected to a discharge voltage terminal 130, under the control of a first control signal provided by a first control signal terminal 120.

In the embodiment of the present disclosures, the first discharge circuit is configured to control the pull-up node to be electrically connected to a discharge voltage terminal, under the control of the first control signal provided by the first control signal terminal, so that it can effectively release the voltage at the pull-up node during the shutdown phase, thereby avoiding the problem that the voltage at the pull-up node maintains a high potential for a long time upon shutdown of the display device, which causes the signal crosstalk within the display device when the display device is started up again, and hence improving the display effect of the screen when the display device is started up. Therefore, the technical solution provided by embodiments of the present disclosure can improve the display effect on the screen when the display device is started up.

The above gate driving circuit includes shift register units connected in N stages, as shown in FIG. 2. An output terminal Output of a first stage of shift register unit is connected to an input terminal Input of an M+1 stage of shift register unit. Each of the shift register units is used to provide a gate scan signal for a gate line connected thereto. In FIG. 2, M=3 for the purpose of illustration. Alternatively, M may also be equal to 4, 6, and so on.

Each of the shift register units includes a pull-up node PU.

Figure 3:
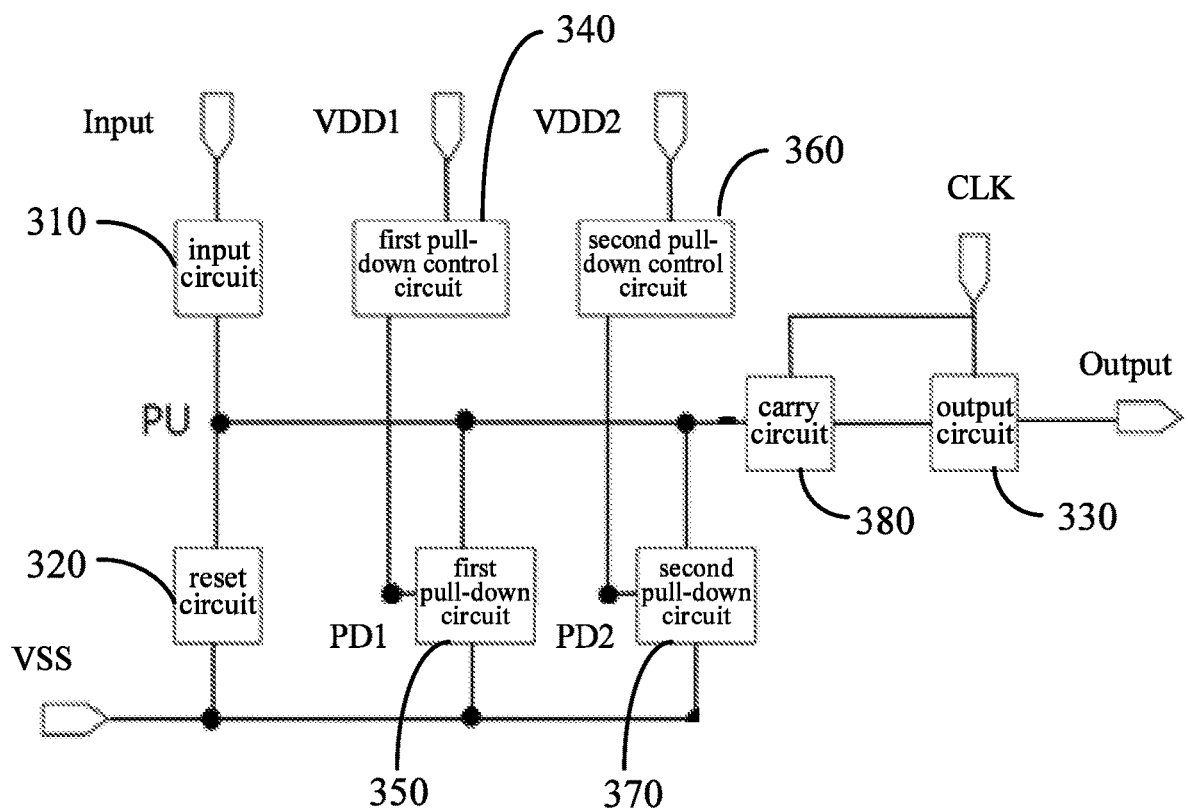
FIG. 3 is a schematic diagram of circuit configuration of a shift register unit in FIG. 2.

As shown in FIG. 3, the shift register unit 300 may include: an input circuit 310, a reset circuit 320 and an output circuit 330.

An input terminal of the input circuit 310 is connected to an input signal terminal Input. An output terminal of the input circuit 310 is connected to the pull-up node PU. The input circuit 310 is configured to charge the pull-up node PU under the control of an input signal. The input signal terminal Input may be an output line of a preceding stage of shift register unit connected to of the current shift register unit.

A first terminal of the reset circuit 320 is connected to a low-potential terminal VSS. A second terminal of the reset circuit 320 is connected to the pull-up node PU. A control terminal of the reset circuit 320 is connected to a reset signal line Reset. The reset circuit 320 is configured to reset a potential at the pull-up node PU under the control of a reset signal.

A first terminal of the output circuit 330 is connected to a target clock signal line CLK (which may be any one of the clock signal lines in the shift register units). A second terminal of the output circuit 330 is connected through the output terminal Output to a respective gate line Gate. A control terminal of the output circuit 330 is connected to the pull-up node PU. The output circuit 330 is configured to output a clock signal to the gate line Gate under the control of the potential at the pull-up node PU.

Further, the above shift register unit 300 may further include: a first pull-down control circuit 340, a first pull-down circuit 350, a second pull-down control circuit 360, a second pull-down circuit 370 and a carry circuit 380.

An input terminal of the first pull-down control circuit 340 is connected to a first power line VDD1, an output terminal of the first pull-down control circuit 340 is connected to a first pull-down node PD1, and the first pull-down control circuit 340 is configured to control a potential at the first pull-down node PD1 under the control of the first power line VDD1.

An control terminal of the first pull-down circuit 350 is connected to the first pull-down node PD1, an input terminal of the first pull-down circuit 350 is connected to the pull-up node PU, an output terminal of the first pull-down circuit 350 is connected to a first low-potential wire LVSS, and the first pull-down circuit 350 is configured to pull down the potential at the pull-up node PU under the control of the potential at the first pull-down node PD1.

An input terminal of the second pull-down control circuit 360 is connected to a second power line VDD2, an output terminal of the second pull-down control circuit 360 is connected to an second pull-down node PD2, and the second pull-down control circuit 360 is configured to control a potential at the second pull-down node PD2 under the control of the second power line VDD2.

An control terminal of the second pull-down circuit 370 is connected to the second pull-down node PD2, an input terminal of the second pull-down circuit 370 is connected to the pull-up node PU, an output terminal of the second pull-down circuit 370 is connected to the first low-potential wire LVSS, and the second pull-down circuit 370 is configured to pull down the potential at the pull-up node PU under the control of the potential at the second pull-down node PD2.

A control terminal of the carry circuit is connected to the pull-up node PU, an input terminal of the carry circuit 380 is connected to the target clock signal line CLK, an output terminal of the carry circuit 380 is connected to an input terminal of an input circuit of the next stage of shift register unit, and the carry circuit 380 is configured to provide the clock signal in the target clock signal line CLK to the input terminal of the input circuit of the next stage of shift register unit, under the control of the potential at the pull-up node PU.

Figure 4:
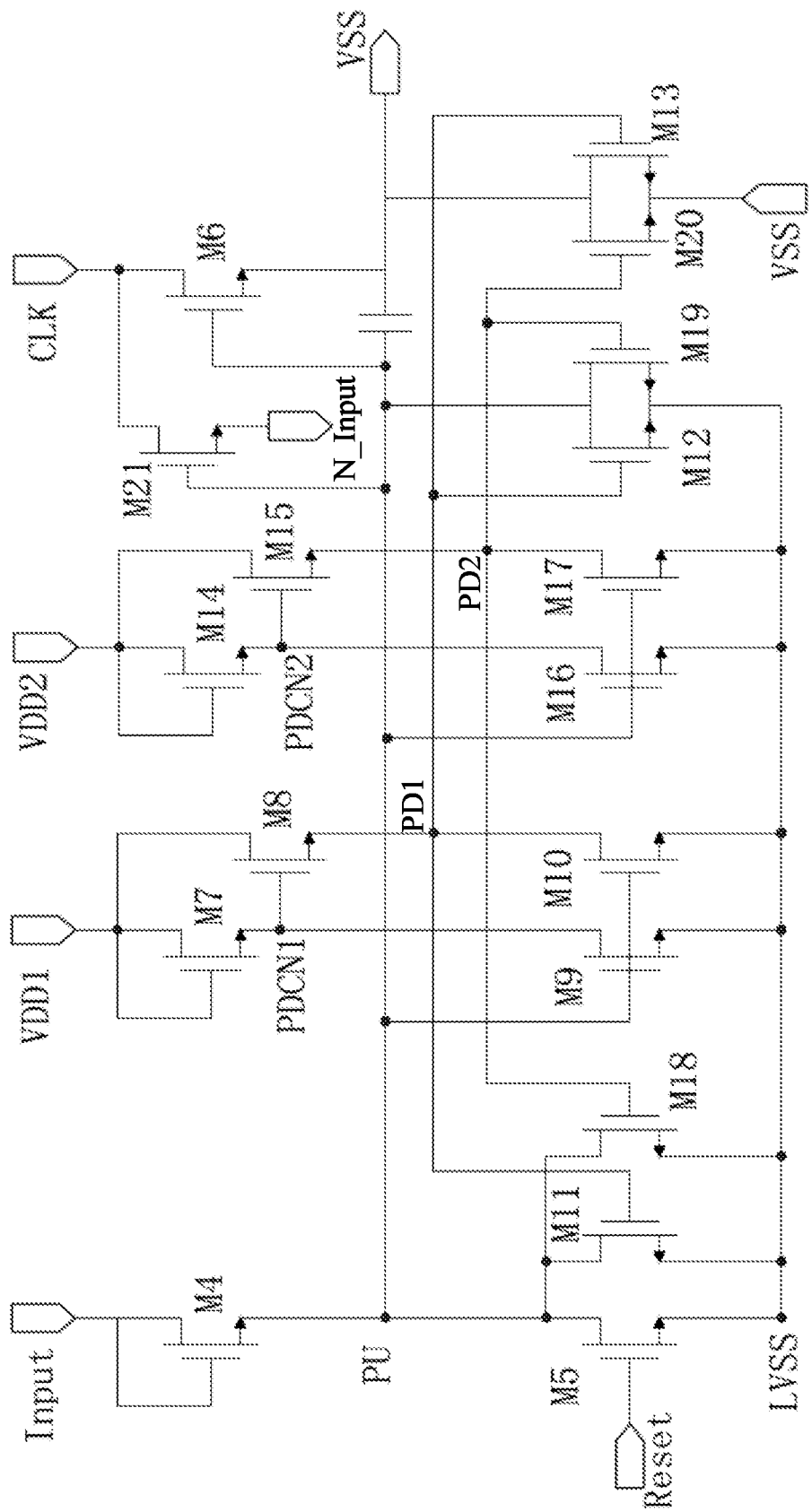
FIG. 4 is a circuit diagram of the shift register unit in FIG. 3.

FIG. 4 is a circuit diagram of the shift register unit shown in FIG. 3. More specifically, as shown in FIG. 4, the input circuit 310 includes a fourth transistor M4. Both a first electrode of the fourth transistor M4 and a control electrode of the fourth transistor M4 are connected to the input signal terminal Input. A second electrode of the fourth transistor M4 is connected to the pull-up node PU. When the signal input terminal Input provides a high level signal, both the first electrode of the fourth transistor M4 and the second electrode of the fourth transistor M4 are electrically connected, to charge the pull-up node PU.

The reset circuit 320 includes a fifth transistor M5. A control electrode of the fifth transistor M5 is connected to the reset signal line Reset. A first electrode of the fifth transistor M5 is connected to the pull-up node PU. A second electrode of the fifth transistor M5 is connected to the first low-potential wire LUSS. When the reset signal line Reset provides a high level signal, both the first electrode of the fifth transistor M5 and the second electrode of the fifth transistor M5 are electrically connected, to reset the potential at the pull-up node PU.

The output circuit 330 includes a sixth transistor M6. A control electrode of the sixth transistor M6 is connected to the pull-up node PU. A first electrode of the sixth transistor M6 is connected to the target clock signal line CLK. A second electrode of the sixth transistor M6 is connected to the gate line Gate. When the pull-up node is at a high level, both the first electrode of the sixth transistor M6 and the second electrode of the sixth transistor M6 are electrically connected, to output a signal on the target clock signal line CLK to the gate line Gate.

A first pull-down control circuit 340 includes a seventh transistor M7, an eighth transistor M8, a ninth transistor M9 and a tenth transistor M10. Both a control electrode of the seventh transistor M7 and a first electrode of the seventh transistor M7 is connected to the first power line VDD1. A second electrode of the seventh transistor M7 is connected to a first pull-down control node PDCN1. A control electrode of the eighth transistor M8 is connected to the first pull-down control node PDCN1. A first electrode of the eighth transistor M8 is connected to the first power line VDD1. A second electrode of the eighth transistor M8 is connected to the first pull-down node PD1. A control electrode of the ninth transistor M9 is connected to the pull-up node PU. A first electrode of the ninth transistor M9 is connected to the first pull-down control node PDCN1. A second electrode of the ninth transistor M9 is connected to the first low-potential wire LVSS. A control electrode of the tenth transistor M10 is connected to the pull-up node PU. A first electrode of the tenth transistor M10 is connected to the first pull-down node PD1. A second electrode of the tenth transistor M10 is connected to the first low-potential wire LVSS. The seventh transistor M7 is configured to control the first pull-down control node PDCN1 to be electrically connected to the first power line VDD1 or electrically disconnected from the first power line VDD1, under the control of the first power line VDD1. The ninth transistor M9 is configured to control the first pull-down control node PDCN1 to be electrically connected to the first low-potential wire LVSS or electrically disconnected from the first low-potential wire LVSS, under the control of the pull-up node PU, thereby controlling the potential at the first pull-down control node PDCN1. The eighth transistor M8 is configured to control the first pull-down node PD1 to be electrically connected to the first power line VDD1 or electrically disconnected from the first power line VDD1 under the control of the potential at the first pull-down control node PDCN1. The tenth transistor M10 is configured to control the first pull-down node PD1 to be electrically connected to the first low-potential wire LVSS or electrically disconnected from the first low-potential wire LVSS, under the control of the pull-up node PU, thereby controlling the potential at the first pull-down node PD1.

The first pull-down circuit 350 includes an eleventh transistor M11, a twelfth transistor M12, and a thirteenth transistor M13. A control electrode of the eleventh transistor M11 is connected to the first pull-down node PD1. A first electrode of the eleventh transistor M11 is connected to the pull-up node PU. A second electrode of the eleventh transistor M11 is connected to the first low-potential wire LVSS. A control electrode of the twelfth transistor M12 is connected to the first pull-down node PD1. A first electrode of the twelfth transistor M12 is connected to the pull-up node PU. A second electrode of the twelfth transistor M12 is connected to the first low-potential wire LVSS. A control electrode of the thirteenth transistor M13 is connected to the first pull-down node PD1. A first electrode of the thirteenth transistor M13 is connected to the second electrode of the sixth transistor M6. A second electrode of the thirteenth transistor M13 is connected to a second low-potential wire VSS. The eleventh transistor M11 is configured to pull down the potential at the pull-up node PU under the control of the potential at the first pull-down node PD1. The twelfth transistor M12 is configured to pull down the potential at the pull-up node PU under the control of the potential at the first pull-down node PD1. The thirteenth transistor M13 is configured to pull down the potential at the output node (at the second electrode of the sixth transistor M6) under the control of the potential at the first pull-down node PD1.

The second pull-down control circuit 360 includes a fourteenth transistor M14, a fifteenth transistor M15, a sixteenth transistor M16, and a seventeenth transistor M17. Both a control electrode of the fourteenth transistor M14 and a first electrode of a fourteenth transistor M14 are connected to the second power line VDD2. A second electrode of the fourteenth transistor M14 is connected to a second pull-down control node PDCN2. A control electrode of the fifteenth transistor M15 is connected to the second pull-down control node PDCN2. A first electrode of the fifteenth transistor M15 is connected to the second power line VDD2. A second electrode of the fifteenth transistor M15 is connected to the second pull-down node PD2. A control electrode of the sixteenth transistor M16 is connected to the pull-up node PU. A first electrode of the sixteenth transistor M16 is connected to the second pull-down control node PDCN2. A second electrode of the sixteenth transistor M16 is connected to the first low-potential wire LUSS. A control electrode of the seventeenth transistor M17 is connected to the pull-up node PU. A first electrode of the seventeenth transistor M17 is connected to the second pull-down node. A second electrode of the seventeenth transistor M17 is connected to the first low-potential wire LVSS. The fourteenth transistor M14 is configured to control the second pull-down control node PDCN2 to be electrically connected to the second power line VDD2 or electrically disconnected from the second power line VDD2, under the control of the second power line VDD2. The sixteenth transistor M16 is configured to control the second pull-down control node PDCN2 to be electrically connected to the first low-potential wire LVSS or electrically disconnected from the first low-potential wire LVSS, under the control of the pull-up node PU, thereby controlling the potential at the second pull-down control node PDCN2. The fifteenth transistor M15 is configured to control the second pull-down node PD2 to be electrically connected to the second power line VDD2 or electrically disconnected from the second power line VDD2, under the control of the potential at the second pull-down control node PDCN2. The seventeenth transistor M17 is configured to control the second pull-down node PD2 to be electrically connected to the first low-potential wire LVSS or electrically disconnected from the first low-potential wire LVSS, under the control of the pull-up node PU, thereby controlling the potential of the second pull-down node PD2.

The second pull-down circuit 370 includes an eighteenth transistor M18, a nineteenth transistor M19, and a twentieth transistor M20. A control electrode of the eighteenth transistor M18 is connected to the second pull-down node PD2. A first electrode of the eighteenth transistor M18 is connected to the pull-up node PU. A second electrode of the eighteenth transistor M18 is connected to the first low-potential wire LVSS. A control electrode of the nineteenth transistor M19 is connected to the second pull-down node PD2. A first electrode of the nineteenth transistor M19 is connected to the pull-up node PU. A second electrode of the nineteenth transistor M19 is connected to the first low-potential wire LUSS. A control electrode of the twentieth transistor M20 is connected to the second pull-down node PD2. A first electrode of the twentieth transistor M20 is connected to the second electrode of the sixth transistor M6. A second electrode of the twentieth transistor M20 is connected to the second low-potential wire VSS. The eighteenth transistor M18 is configured to pull down the potential at the pull-up node PU under the control of the potential at the second pull-down node PD2. The nineteenth transistor M19 is configured to pull down the potential at the pull-up node PU under the control of the potential at the second pull-down node PD2. The twentieth transistor M20 is configured to pull down the potential at the output node (at the second electrode of the sixth transistor M6) under the control of the potential at the second pull-down node PD2.

The carry circuit 380 includes a twenty-first transistor M21. A control electrode of the twenty-first transistor M21 is connected to the pull-up node PU. A first electrode of the twenty-first transistor M21 is connected to the target clock signal line CLK. A second electrode of the twenty-first transistor M21 is connected to an input terminal N_Input of an input circuit of the next stage of shift register unit. A twenty-first transistor M21 is configured to provide the clock signal on the target clock signal line CLK to the input terminal N_Input of the input circuit of the next stage of shift register unit, under the control of the potential at the pull-up node PU.

Figure 5:
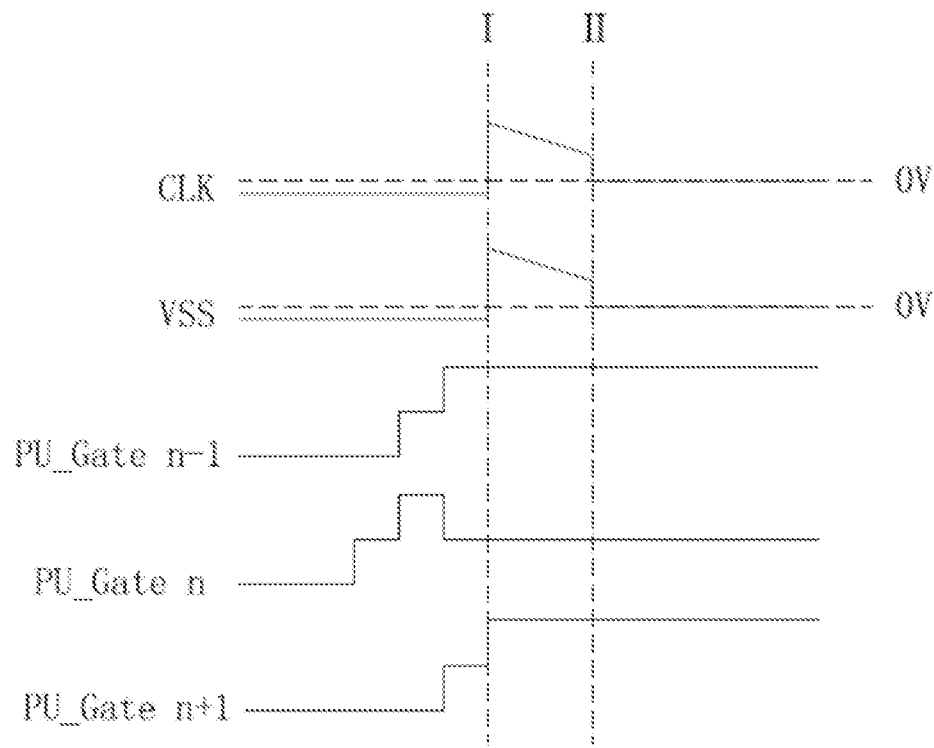
FIG. 5 is a timing diagram of a potential at a pull-up node of a portion of the shift register unit in the related art.

In the shutdown phase of the display device, in the case that there is no the first discharge circuit, when the gate scan signal of the display device is scanning the $n^{th}$ row of the sub-pixels, the corresponding pull-up node PU is PU_Gate n, and in this case, the pull-up node PU_Gate n of the current shift register unit for the $n^{th}$ row of the gate line as well as the pull-up nodes PU_Gate n−1 and PU_Gate n+1 of shift register units that are for the preceding several rows and the next several rows of gate lines and connected to the current shift register unit in the gate driving circuit are all at a high level, as shown in FIG. 5. Since there is no related discharge path for the pull-up node PU, it would cause the pull-up node PU to still maintain a high potential for a long period time after the shutdown operation, so that a signal crosstalk will occur within the display device when the display device is started up next time, thereby causing an abnormal display in startup screen of the display device.

Figure 6:
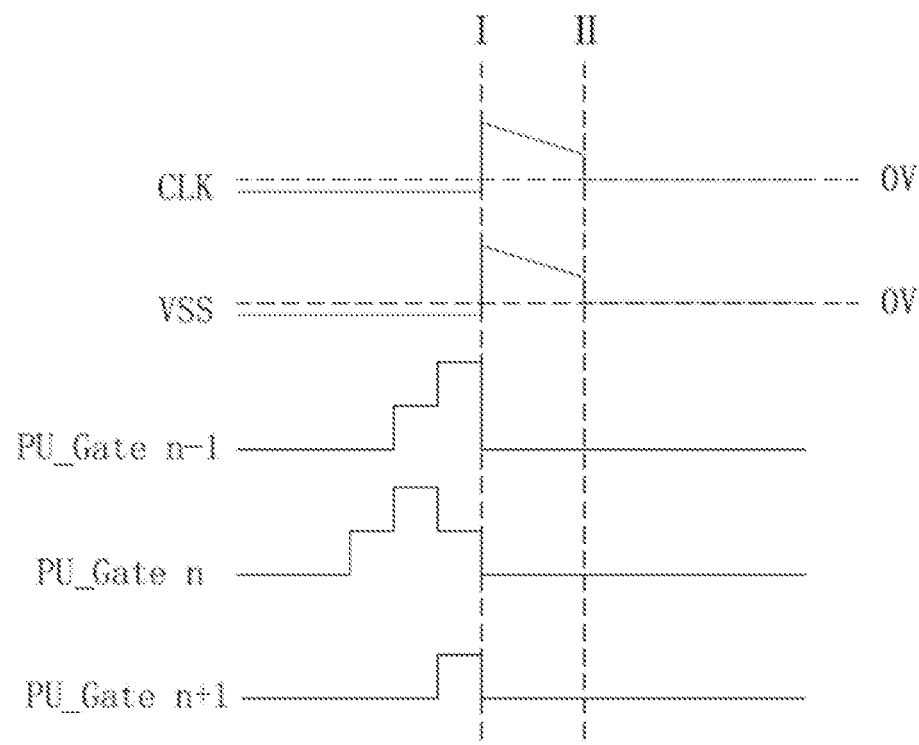
FIG. 6 is timing diagram of the potential at the pull-up node of the portion of the shift register unit as shown in FIG. 5 after the first discharge circuit performs a discharge operation.

According to embodiments of the present disclosure, the first discharge circuit 110 is provided to the shift register unit, and is connected to the pull-up node PU and the discharging voltage terminal 130 respectively. The first discharge circuit 110 is configured to control, under the control of the first signal terminal 120, the pull-up node PU to be electrically connected to the discharge voltage terminal 130, so as to form a discharge path for the pull-up node PU. Thus, in the shutdown phase, the first discharge circuit 110 is provided, when the gate scan signal of the display device is scanning the $n^{th}$ row of sub-pixels, the potential at the pull-up node PU_Gate n of the current shift register unit for the $n^{th}$ row of the gate line as well as the pull-up nodes PU_Gate n−1 and PU_Gate n+1 of shift register units that are for the preceding several rows and the next several rows of gate lines and connected to the current shift register unit in the gate driving circuit are all pulled down, as shown in FIG. 6, thereby prevent the signal crosstalk from occurring within the display device when the device is started up next time, and thus prevent abnormal display in startup screen of the display device.

The above discharge voltage terminal 130 may be grounded, or may be another terminal having a potential lower than the potential in the common wire. By connecting the pull-up node PU to the discharge voltage terminal 130, the potential at the pull-up node PU can be reduced.

Figure 7:
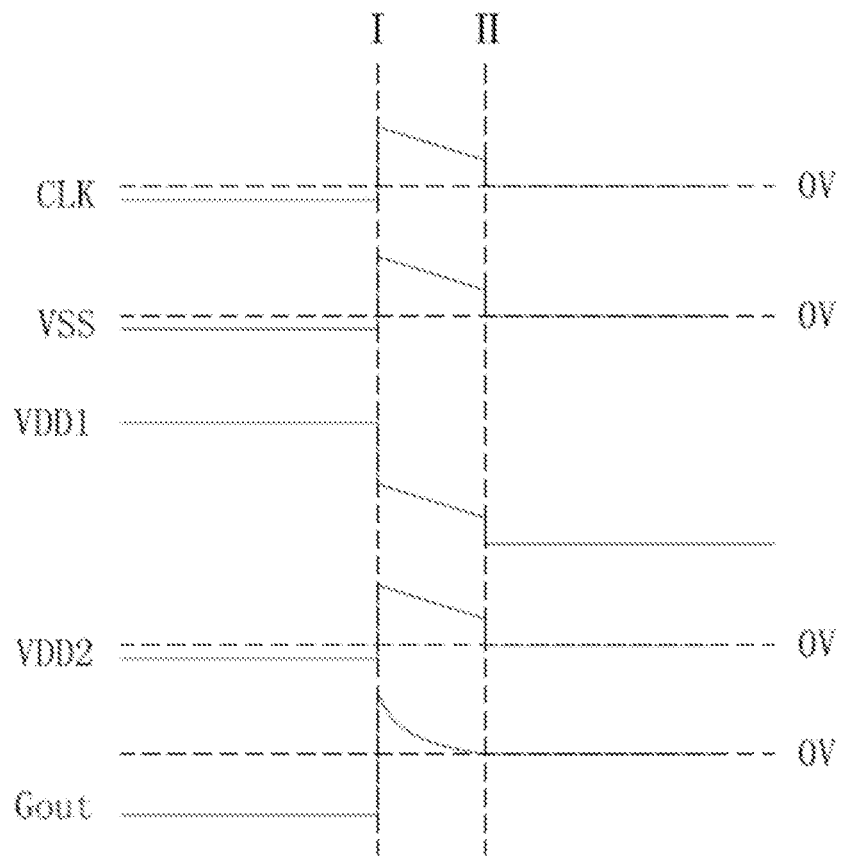
FIG. 7 is a timing diagram of potentials at signal lines in the gate driving circuit under a X on function in the related art.

Furthermore, the display device in general includes a Xon function (commonly referred to as a Disch function in GOA products). That is, when a Xon (Disch) generating unit detects that an input voltage Vin (that is, the normal operating voltage) of a power Integrated Circuit (IC) is dropped down to a certain voltage value due to the shutdown operation, the Xon function (Disch function) is enabled to output the Xon (Disch) signal to the gate driving circuit module (such as a GOA circuit module), so that the electrical signals on all the signal lines (for example, the low-level signal line VSS of GOA, the clock signal line CLK, the power signal lines VDD1 and VDD2, etc.) in the gate driving circuit module are pulled to be at a high level, as shown in FIG. 7 where the time I refers to a time when the signals of the signal lines are pulled up by the Xon function.

Thus, the signal line, which is pulled to be at a high level by the gate driving circuit module when the Xon function (Disch function) is enabled, may be employed as the first control signal terminal 120, thereby saving the cost for additionally providing the signal terminal in the display panel.

Figure 8:
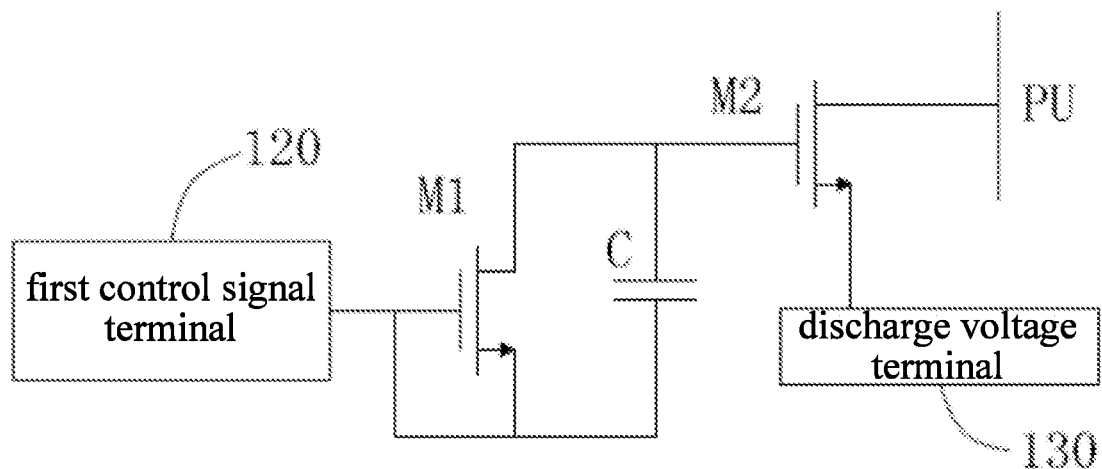
FIG. 8 is a circuit diagram of a first discharge circuit in a shutdown discharge circuit according to another embodiment of the present disclosure.

Further, as shown in FIG. 8, the first discharging circuit 110 includes a first transistor M1, a second transistor M2 and a discharge capacitor C. Both a first electrode of the first transistor M1 and a control electrode of the first transistor M1 are connected electrically to the first control signal terminal 120. A second electrode of the first transistor M1 is electrically connected to a control electrode of the second transistor M2. A first electrode of the second transistor M2 is electrically connected to the pull-up node PU. A second electrode of the second transistor M2 is electrically connected to the discharge voltage terminal 130. A terminal of the discharge capacitor C is connected to the first electrode of the first transistor M1. Another terminal of the capacitor C is connected to the second electrode of the first transistor M1.

For example, the low-level wire VSS functions as the first control signal terminal. In this case, in the normal display phase, the low-level wire VSS remains a low-level signal, so that the first electrode of the first transistor M1 is electrically disconnected from the second electrode of the first transistor M1, and the pull-up node PU maintains a normal operating voltage. In the shutdown phase, the signal in the low-level wire VSS is pulled up to be a high-level signal, so that the first electrode of the first transistor M1 is electrically connected to the second electrode of the first transistor M1, and hence the high-level signal is inputted into the control electrode of the second transistor M2, which in turn causes the first electrode of the second transistor M2 to be electrically connected to the second electrode of the second transistor M2. That is, electrical connection between the pull-up node PU and the discharge voltage terminal 130 enables to discharge the pull-up node PU, while charging the capacitor C. When the signal on the low-level wire VSS is dropped down to a low level, the first electrode of the first transistor M1 is electrically disconnected from the second electrode of the first transistor M1, the capacitor C is discharged, which continues to electrically connect the first electrode of the second transistor M2 to the second electrode of the second transistor M2, so that the pull-up node PU continues discharging, thereby prolonging the discharge time of pull-up node PU to ensure the pull-up node PU to be discharged completely.

Figure 9:
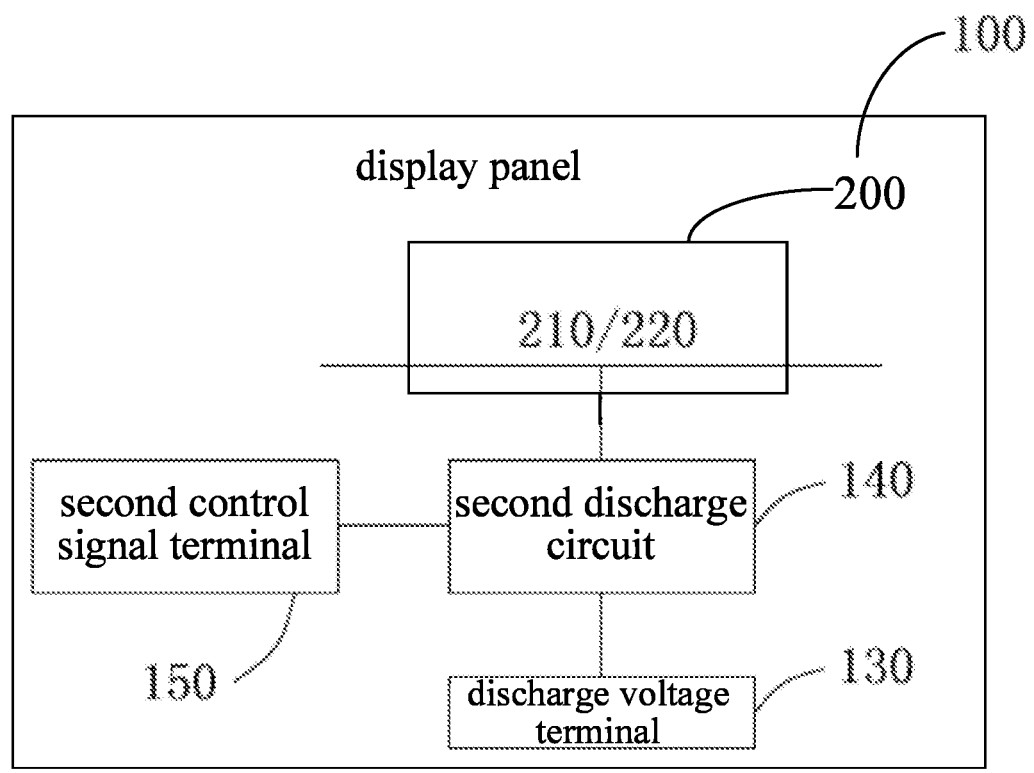
FIG. 9 is a schematic structural diagram of a second discharge circuit in the shutdown discharge circuit according to another embodiment of the present disclosure.
Figure 10:
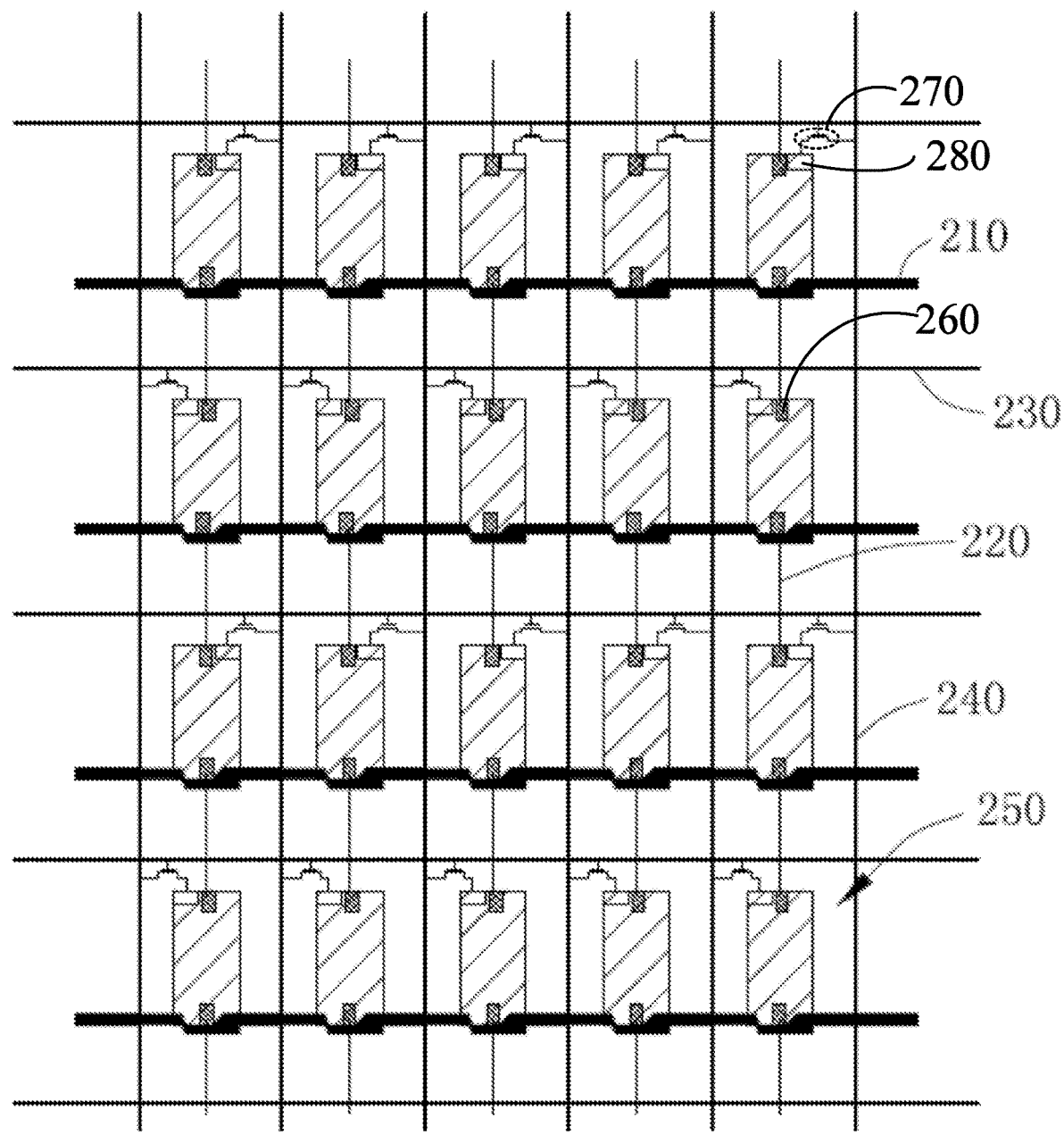
FIG. 10 a schematic structural diagram of a pixel circuit of a display panel in FIG. 9.

Further, the display panel further includes a pixel circuit 200. As shown in FIG. 9 and FIG. 10, the pixel circuit 200 includes a common wire. The common wire includes a common electrode line 210 and a common electrode line compensation structure 220. The shutdown discharge circuit further includes a second discharge circuit 140. Optionally, the common electrode line compensation structure is a wire, and is configured to connect the common electrodes 260 within two pixel regions 250 located in adjacent rows and a same column of a pixel region array.

The second discharge circuit 140 is configured to control the common electrode line 210 or the common electrode line compensation structure 220 to be electrically connected to the discharge voltage terminal 130 under the control of a second control signal provided by the second control signal terminal 150.

The pixel circuit further includes gate lines 230 extending in a row direction and data lines 240 extending in a column direction on the substrate. The gate lines 230 and the data lines 240 are intersected with each other to form a plurality of pixel regions 250. A TFT 270, a pixel electrode 280 and a common electrode 260 are disposed in each of the pixel regions 270. A source electrode of the TFT 270 is connected to the data line 240, and a drain electrode of the TFT 270 is connected to the pixel electrode 280. The display panel further includes a common electrode line 210 and a common electrode line compensation structure 220. The common electrode line 210 is parallel to the gate line 230, and the common electrodes 260 arranged in a same row are connected to a same common electrode line 210. The common electrodes 260 arranged in a same column and adjacent to each other are connected to each other through the common electrode line compensation structure 220.

The common electrode line 210 is configured to supply power to the common electrodes 260 in the pixel regions, which are connected to the same gate line. The common electrode line compensation structure 220 is configured to connect the common electrodes 260 within two pixel regions located adjacent rows and a same column.

Once the display device is shut down, the input voltage Vin starts to be dropped down, while the voltages at the common electrode line 210 and the common electrode line compensation structure 220, as well as the voltage at the data line 240 start to be dropped down. Based on the Xon function described above, after all signals of the display device are pulled to be at a high level, the TFT of each pixel region in the pixel circuit is turned on, and the pixel electrode is discharged. When the voltage of the VGH signal used to turn on the TFT in the pixel region is dropped down to a certain voltage (approximately 3V), the respective signal lines may be instantaneously pulled down to approximately 0V voltage based on the voltage of the VGL signal used to turn off the TFT in the pixel region, as shown by time II in FIG. 7. At this time, the GOA output signal Gout is turned off, i.e. all the gate signal lines in the screen are in a turned-off state, and the discharge of the pixel electrode is completed. However, the voltages on the common electrode line 210 and the common electrode line compensation structure 220 are released slowly, and hence are not completely dropped down to be 0V when the discharge of the pixel electrode is completed, so that there is still a voltage difference between the voltage on the common electrode line 210 and the common electrode line compensation structure 220 and the voltage on the pixel electrode, also causing a residual image when the display device is shut down.

According to the embodiments of the present disclosure, the second discharge circuit 140 is provided to the pixel circuit, and is connected to a common wire (including the electrode line 210 and the common electrode line compensation structure 220) and the discharge voltage terminal 130. The second discharge circuit 140 is configured to control, under the control of the second control signal terminal 150, the common wire to be electrically connected to the discharge voltage terminal 130. The common electrode line 210 is connected to the common electrode line compensation structure 220 through the common electrode. Therefore, the charging operation can be achieved as long as any of the common electrode line 210 and the common electrode line compensation structure 220 is discharged.

Figure 11:
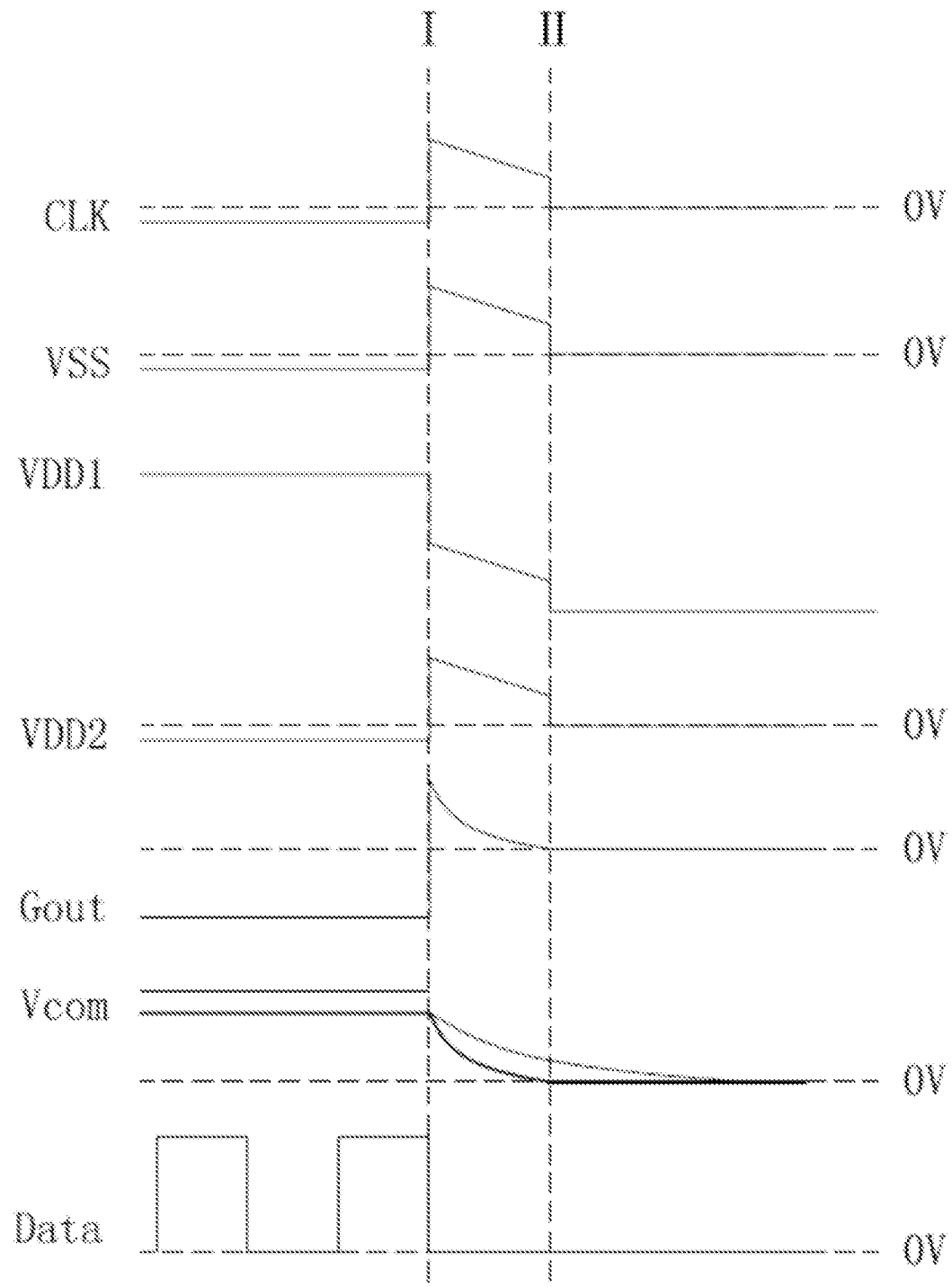
FIG. 11 is a timing diagram of potentials at common wires in the shutdown discharge circuit according to another embodiment of the present disclosure.

In the shutdown phase, in the case that the common electrode line 210 and the common electrode line compensation structure 220 are not discharged through the first discharge circuit, a change in the voltage on the common electrode line 210 are shown as a thin line of Vcom in FIG. 11; and in the case that the common electrode line 210 and a common electrode line compensation structure 220 are discharged through the first discharging circuit 110, a change in the voltage in the common electrode line 210 are shown as a thick line of Vcom in FIG. 11. The potential of the voltage in the common wire is reduced by the second discharge circuit 140, thereby reducing the voltage difference between the voltage in the common wire and the voltage in the pixel electrode, so as to prevent from the occurrence of the residual image when the display device is shut down.

The signal line, which is pulled to be at a high level by the gate driving circuit module when the Xon function (Disch function) is enabled, may be employed as the second control signal terminal 150, so as to save the cost of additionally providing the signal terminal in the display panel.

Figure 12:
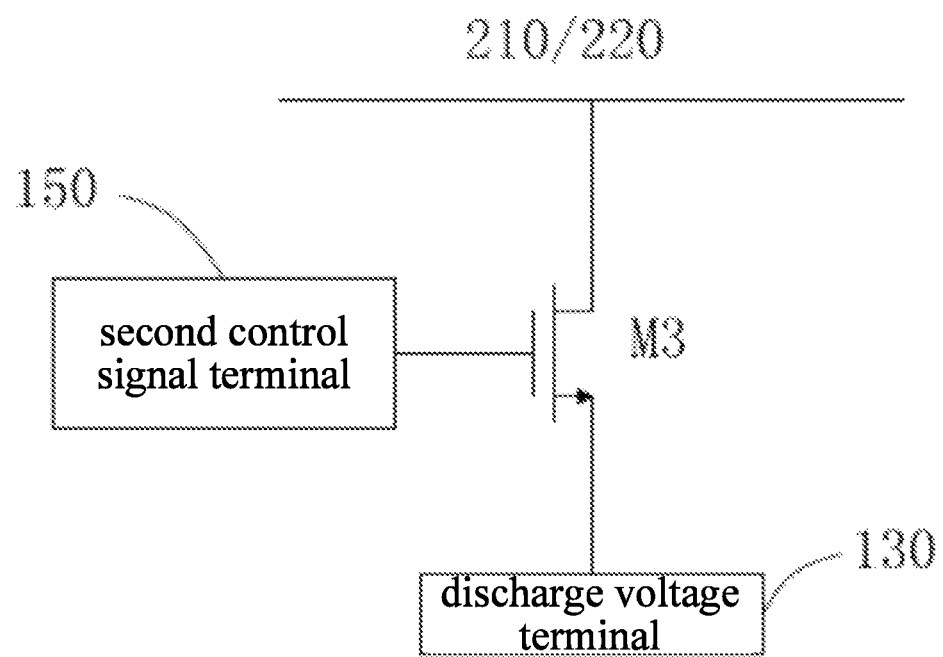
FIG. 12 is a circuit diagram of the second discharge circuit in the shutdown discharge circuit according to another embodiment of the present disclosure.

Further, as shown in FIG. 12, the second discharge circuit 140 includes a third transistor M3. A first electrode of the third transistor M3 is electrically connected to the common electrode line 210 or the common electrode line compensation structure 220. A second electrode of the third transistor M3 is electrically connected to the discharge voltage terminal 130. A control electrode of the third transistor M3 is electrically connected to the second control signal terminal 150.

For example, the low-level wire VSS functions as the second control signal terminal. In this case, in the normal display phase, the low-level wire VSS remains a low-level signal, so that the first electrode of the third transistor M3 is electrically disconnected from the second electrode of the third transistor M3, and the common electrode line 210 and the common electrode line compensation structure 220 maintain a normal operating voltage. In the shutdown phase, the signal in the low-level wire VSS is pulled up to be a high-level signal, so that the first electrode of the third transistor M3 is electrically connected to the second electrode of the third transistor M3, that is, the common electrode line 210 and the common electrode line compensation structure 220 are electrically connected to the discharge voltage terminal 130, thereby realizing the discharge of the common electrode line 210 or the common electrode line compensation structure 220.

An embodiment of the present disclosure also provides a display panel including the shutdown discharge circuit as described above.

Further, the display panel may further include a shift register unit, which may refer to description in embodiments as shown in FIGS. 1 to 8, and will not be discussed repeatedly herein.

Further, the display panel may further include a pixel circuit, which may refer to description in embodiments as shown in FIGS. 9 to 12, and will not be discussed repeatedly herein.

An embodiment of the present disclosure further provides a control method for the shutdown discharge circuit as described above. The method including the following steps.

In the shutdown phase, the first control signal terminal outputs a first control signal, and the first discharge circuit controls the common electrode line or the common electrode line compensation structure to be electrically connected to the discharge voltage terminal under the control of the first control signal.

According to the embodiments of the present disclosure, the first discharging circuit is provided to the shift register unit, and is connected to the pull-up node PU and the discharging voltage terminal. After the first control signal is output by the first control signal terminal, the first discharge circuit is configured to control, under the control of the first control signal, the pull-up node PU to be electrically connected to the discharge voltage terminal, so as to form a discharge path for the pull-up node PU.

Thus, in the shutdown phase, when the gate scan signal of the display device is scanning the $n^{th}$ row of the sub-pixels, the potential at the pull-up node of the current shift register unit for the $n^{th}$ row of the gate line as well as the pull-up nodes of shift register units that are for the preceding several rows and the next several rows of gate lines and connected to the current shift register unit in the gate driving circuit are all pulled down, as shown in FIG. 6, thereby prevent the signal crosstalk from occurring within the display device when the device is started up next time, and thus improving the display quality of the screen when the display device is started up.

Further, the display panel includes a gate driving circuit. The gate driving circuit includes multiple stages of shift register units. The shift register unit includes a pull-up node. The shutdown discharge circuit further includes a second discharge circuit. The second discharge circuit is configured to control the pull-up node to be electrically connected to the discharge voltage terminal under the control of the second control signal terminal.

The method further includes the following steps.

In the shutdown phase, the second control signal is output by the second control signal terminal, and the second discharge circuit controls the pull-up node to be electrically connected to the discharge voltage terminal under the control of the second control signal.

According to the embodiments of the present disclosure, the second discharge circuit is provided to the pixel circuit, and is connected to a common wire (including the electrode line and the common electrode line compensation structure) and the discharge voltage terminal. After the second control signal is output by the second control signal terminal, the second discharge circuit controls, under the control of the second control signal terminal, the common wire to be electrically connected to the discharge voltage terminal, so as to form a discharge path for the common wire.

Thus, in the shutdown phase, the voltage of the common wire can be released while releasing the voltage in the pixel electrode, so that the voltage difference between the voltage in the common wire and the voltage in the pixel electrode can be reduced to prevent occurrence of the residual image of the display device.

An embodiment of the present disclosure also provides a display device including the pixel circuit as described above.

The display device may be a display, a mobile phone, a tablet computer, a television, a wearable electronic device, a navigation display device, etc., to improve the display quality of the shutdown screen of the display device.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words such as "including" or "comprising" indicates that the element or item appearing before the word covers the element or item appearing after the word and the equivalent thereof without excluding other elements or items. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It would be appreciated that, when an element such as a layer, a film, a region, or a substrate is referred to be located "on" or "under" another element, the element may be "directly" located "on" or "under" the other element, or there may be an intermediate element between the element and the other element.

Embodiments of the present disclosure have been described above with reference to the accompanying drawings, but the present disclosure is not limited to the specific implementations described above. The specific implementations described above are only schematic but not restrictive. Under the inspiration of the present disclosure, a person skilled in the art may make various modifications without departing from the spirit of the present disclosure and the scope of protection of the claims, which should fall within the protection scope of the present disclosure.

What is claimed is:

1. A gate driving circuit, comprising:
   multiple stages of shift register units and a shutdown discharge circuit, wherein the shutdown discharge circuit comprises a first discharge circuit,
   wherein the first discharge circuit is electrically connected to a pull-up node and a discharge voltage terminal, and is configured to control the pull-up node to be electrically connected to the discharge voltage terminal under the control of a first control signal provided by a first control signal terminal,
   wherein the first discharge circuit comprises a first transistor, a second transistor and a discharge capacitor,
   wherein both a first electrode of the first transistor and a control electrode of the first transistor are directly connected to the first control signal terminal, and a second electrode of the first transistor is directly connected to a control electrode of the second transistor;
   a first electrode of the second transistor is directly connected to the pull-up node, and a second electrode of the second transistor is directly connected to the discharge voltage terminal; and
   a terminal of the discharge capacitor is directly connected to the first electrode of the first transistor, and another terminal of the discharge capacitor is directly connected to the second electrode of the first transistor.

2. The gate driving circuit according to claim 1, wherein a display panel comprises a pixel circuit, the pixel circuit comprises a common electrode line and a common electrode line compensation structure, and the shutdown discharge circuit further comprises a second discharge circuit;
   the second discharge circuit is electrically connected to the common electrode line or the common electrode line compensation structure, is electrically connected to the discharge voltage terminal, and is configured to control the common electrode line or the common electrode line compensation structure to be electrically connected to the discharge voltage terminal under the control of a second control signal provided by a second control signal terminal.

3. The gate driving circuit according to claim 2, wherein the second discharge circuit comprises a third transistor,
   wherein a control electrode of the third transistor is electrically connected to the second control signal terminal, a first electrode of the third transistor is electrically connected to the common electrode line or the common electrode line compensation structure, and a second electrode of the third transistor is electrically connected to the discharge voltage terminal.

4. The gate driving circuit according to claim 2, wherein the common electrode line compensation structure is a wire, and gate lines and data lines of the display panel are intersected with each other to form a plurality of pixel regions arranged in an array, and the common electrode line compensation structure is configured to connect the common electrodes within two pixel regions located in adjacent rows and a same column of the array.

5. The gate driving circuit according to claim 1, wherein the shift register unit further comprises: an input circuit, a reset circuit, an output circuit, a first pull-down control circuit, a first pull-down circuit, a second pull-down control circuit, a second pull-down circuit and a carry circuit,
   wherein an input terminal of the input circuit is connected to an input signal terminal, an output terminal of the input circuit is connected to the pull-up node, and the input circuit is configured to charge the pull-up node under the control of the input signal;

a first terminal of the reset circuit is connected to a low-potential terminal, a second terminal of the reset circuit is connected to the pull-up node, a control terminal of the reset circuit is connected to a reset signal line, and the reset circuit is configured to reset a potential at the pull-up node under the control of a reset signal;

a first terminal of the output circuit is connected to a target clock signal line, a second terminal of the output circuit is connected to a gate line, a control terminal of the output circuit is connected to the pull-up node, and the output circuit is configured to output a clock signal to the gate line under the control of the potential at the pull-up node;

an input terminal of the first pull-down control circuit is connected to a first power line, an output terminal of the first pull-down control circuit is connected to a first pull-down node, and the first pull-down control circuit is configured to control a potential at the first pull-down node under the control of a first power source line;

a control terminal of the first pull-down circuit is connected to the first pull-down node, an input terminal of the first pull-down circuit is connected to the pull-up node, and an output terminal of the first pull-down circuit is connected to a first low-potential wire, and the first pull-down circuit is configure to pull down the potential at the pull-up node under the control of the potential at the first pull-down node;

an input terminal of the second pull-down control circuit is connected to a second power line, an output terminal of the second pull-down control circuit is connected to a second pull-down node, and the second pull-down control circuit is configured to control a potential at the second pull-down node under the control of the second power line;

a control terminal of the second pull-down circuit is connected to the second pull-down node, an input terminal of the second pull-down circuit is connected to the pull-up node, an output terminal of the second pull-down circuit is connected to the first low-potential wire, and the second pull-down circuit is configured to pull down the potential at the pull-up node under the control of the potential at the second pull-down node; and a control terminal of the carry circuit is connected to the pull-up node, an input terminal of the carry circuit is connected to a target clock signal line, an output terminal of the carry circuit is connected to an input terminal of an input circuit of a next stage of shift register unit, and the carry circuit is configured to provide the clock signal in the target clock signal line to the input terminal of the input circuit of the next stage of shift register unit under the control of the potential at the pull-up node.

6. The gate driving circuit according to claim 5, wherein the input circuit comprises a fourth transistor, wherein both a first electrode of the fourth transistor and a control electrode of the fourth transistor are connected to the input signal terminal, and a second electrode of the fourth transistor is connected to the pull-up node;

the reset circuit comprises a fifth transistor, wherein a control electrode of the fifth transistor is connected to a reset signal line, a first electrode of the fifth transistor is connected to a pull-up node, and a second electrode of the fifth transistor is connected to a first low-potential wire;

the output circuit comprises a sixth transistor, wherein a control electrode of the sixth transistor is connected to the pull-up node, a first electrode of the sixth transistor is connected to the target clock signal line, and a second electrode of the sixth transistor is connected to the gate line;

the first pull-down control circuit comprises a seventh transistor, an eighth transistor, a ninth transistor and a tenth transistor, wherein both a control electrode of the seventh transistor and a first electrode of the seventh transistor are connected to the first power line, a second electrode of the seven transistor is connected to a first pull-down control node; a control electrode of the eighth transistor is connected to the first pull-down control node, a first electrode of the eighth transistor is connected to the first power line, a second electrode of the eighth transistor is connected to the first pull-down node; a control electrode of the ninth transistor is connected to the pull-up node, a first electrode of the ninth transistor is connected to the first pull-down control node, a second electrode of the ninth transistor is connected to the first low-potential wire; a control electrode of the tenth transistor is connected to the pull-up node, a first electrode of the tenth transistor is connected to the first pull-down node, and a second electrode of the tenth transistor is connected to the first low-potential wire;

the first pull-down circuit comprises an eleventh transistor, a twelfth transistor and a thirteenth transistor, wherein a control electrode of the eleventh transistor is connected to the first pull-down node, a first electrode of the eleventh transistor is connected to the pull-up node, a second electrode of the eleventh transistor is connected to the first low-potential wire; a control electrode of the twelfth transistor is connected to the first pull-down node, a first electrode of the twelfth transistor is connected to the pull-up node, a second electrode of the twelfth transistor is connected to the first low-potential wire; a control electrode of the thirteenth transistor is connected to the first pull-down node, a first electrode of the thirteenth transistor is connected to the second electrode of the sixth transistor, and a second electrode of the thirteenth transistor is connected to a second low-potential wire;

the second pull-down control circuit comprises a fourteenth transistor, a fifteenth transistor, a sixteenth transistor and a seventeenth transistor, wherein both a control electrode of the fourteenth transistor and a first electrode of the fourteenth transistor are connected to the second power line, a second electrode of the fourteenth transistor is connected to a second pull-down control node; a control electrode of the fifteenth transistor is connected to the second pull-down control node, a first electrode of the fifteenth transistor is connected to the second power line, a second electrode of the fifteenth transistor is connected to the second pull-down node; a control electrode of the sixteenth transistor is connected to the pull-up node, a first electrode of the sixteenth transistor is connected to the second pull-down control node, a second electrode of the sixteenth transistor is connected to the first low-potential wire; a control electrode of the seventeenth transistor is connected to the pull-up node, a first electrode of the seventeenth transistor is connected to the second pull-down node, and a second electrode of the seventeenth transistor is connected to the first low-potential wire;

the second pull-down circuit comprises an eighteenth transistor, a nineteenth transistor and a twentieth transistor, wherein a control electrode of the eighteenth transistor is connected to the second pull-down node, a first electrode of the eighteenth transistor is connected to the pull-up node, a second electrode of the eighteenth transistor is connected to the first low-potential wire; a control electrode of the nineteenth transistor is connected to the second pull-down node, a first electrode of the nineteenth transistor is connected to the pull-up node, a second electrode of the nineteenth transistor is connected to the first low-potential wire; a control electrode of the twentieth transistor is connected to the second pull-down node, a first electrode of the twentieth transistor is connected to the second electrode of the sixth transistor, and a second electrode of the twentieth transistor is connected to the second low-potential wire; and the carry circuit comprises a twenty-first transistor, wherein a control electrode of the twenty-first transistor is connected to the pull-up node, a first electrode of the twenty-first transistor is connected to the target clock signal line, and a second electrode of the twenty-first transistor is connected to the input terminal of the input circuit of the next stage of shift register unit.

7. The gate driving circuit according to claim 1, wherein the shift register unit further comprises an input circuit, a reset circuit and an output circuit, wherein the input circuit is configured to charge the pull-up node under the control of an input signal provided by an input terminal;

the reset circuit is configured to reset a potential at the pull-up node under the control of a reset signal provided by a reset terminal; and the output circuit is configured to control a gate driving signal outputting terminal to output the gate driving signal under the control of both a potential at a pull-down node and the potential at the pull-up node.

8. A display panel, comprising the gate driving circuit according to claim 1.

9. The display panel according to claim 8, wherein the display panel further comprises a pixel circuit, the pixel circuit comprises:

a plurality of gate lines arranged in rows and a plurality of data lines arranged in columns on a base substrate, wherein the gate lines and the data lines are intersected with each other to form a plurality of pixel regions, wherein a Thin Film Transistor (TFT), a pixel electrode and a common electrode are disposed in each of the pixel regions, a source electrode of the TFT is connected to the data line, and a drain electrode of the TFT is connected to the pixel electrode;

the display panel further comprises a plurality of common electrode lines arranged in rows and a plurality of common electrode line compensation structures arranged in columns, wherein the common electrodes arranged in a same row are connected to a same common electrode line, and the common electrodes arranged in a same column and adjacent to each other are connected to each other through the common electrode line compensation structure;

the shutdown discharge circuit comprises a second discharge circuit, wherein the second discharge circuit is electrically connected to the common electrode line or the common electrode line compensation structure, and is configured to control the common electrode line or the common electrode line compensation structure to be electrically connected to the discharge voltage terminal under the control of a second control signal provided by a second control signal terminal.

10. The display panel according to claim 8, wherein the display panel further comprises a pixel circuit, the pixel circuit comprises a common electrode line and a common electrode line compensation structure, and the shutdown discharge circuit further comprises a second discharge circuit;

the second discharge circuit is electrically connected to the common electrode line or the common electrode line compensation structure, is electrically connected to the discharge voltage terminal, and is configured to control the common electrode line or the common electrode line compensation structure to be electrically connected to the discharge voltage terminal under the control of a second control signal provided by a second control signal terminal.

11. The display panel according to claim 10, wherein the second discharge circuit comprises a third transistor, wherein a control electrode of the third transistor is electrically connected to the second control signal terminal, a first electrode of the third transistor is electrically connected to the common electrode line or the common electrode line compensation structure, and a second electrode of the third transistor is electrically connected to the discharge voltage terminal.

12. The display panel according to claim 10, wherein the common electrode line compensation structure is a wire, and gate lines and data lines of the display panel are intersected with each other to form a plurality of pixel regions arranged in an array, and the common electrode line compensation structure is configured to connect the common electrodes within two pixel regions located in adjacent rows and a same column of the array.

13. A display device, comprising the display panel according to claim 8.

14. A control method for the gate driving circuit according to claim 1, comprising:

outputting, by the first control signal terminal in a shutdown phase, the first control signal, wherein the first discharge circuit is configured to control an electrical connection between the pull-up node and the discharge voltage terminal under the control of the first control signal.

15. The control method according to claim 14, wherein a display panel comprises a pixel circuit, the pixel circuit comprises a common electrode line and a common electrode line compensation structure, and the shutdown discharge circuit further comprises a second discharge circuit; the second discharge circuit is electrically connected to the common electrode line or the common electrode line compensation structure, and is configured to control the common electrode line or the common electrode line compensation structure to be electrically connected to the discharge voltage terminal under the control of a second control signal provided by a second control signal terminal, wherein the control method further comprises: outputting, by the second control signal terminal in the shutdown phase, the second control signal, wherein the second discharge circuit is configured to control an electrical connection between the common electrode line or the common electrode line compensation structure and the discharge voltage terminal under the control of the second control signal.

16. A gate driving circuit, comprising: multiple stages of shift register units and a shutdown discharge circuit, wherein:
   the shutdown discharge circuit comprises a first discharge circuit,
   the first discharge circuit is electrically connected to a pull-up node and a discharge voltage terminal, and is configured to control the pull-up node to be electrically connected to the discharge voltage terminal under the control of a first control signal provided by a first control signal terminal;
   a display panel comprises a pixel circuit, the pixel circuit comprises a common electrode line and a common electrode line compensation structure, and the shutdown discharge circuit further comprises a second discharge circuit;
   the second discharge circuit is electrically connected to the common electrode line or the common electrode line compensation structure, is electrically connected to the discharge voltage terminal, and is configured to control the common electrode line or the common electrode line compensation structure to be electrically connected to the discharge voltage terminal under the control of a second control signal provided by a second control signal terminal; and
   the second discharge circuit comprises a third transistor,
   a control electrode of the third transistor is directly connected to the second control signal terminal, a first electrode of the third transistor is directly connected to the common electrode line or the common electrode line compensation structure, and a second electrode of the third transistor is directly connected to the discharge voltage terminal.

* * * * *